(12) United States Patent
Mangold et al.

(10) Patent No.: US 9,202,577 B2
(45) Date of Patent: Dec. 1, 2015

(54) SOLID STATE DRIVE MANAGEMENT IN POWER LOSS RECOVERY

(75) Inventors: Richard P. Mangold, Forest Grove, OR (US); Richard L. Coulson, Portland, OR (US); Robert J. Royer, Jr., Portland, OR (US); Sanjeev N. Trika, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 175 days.

(21) Appl. No.: 13/976,002

(22) PCT Filed: Jun. 7, 2012

(86) PCT No.: PCT/US2012/041413
§ 371 (c)(1),
(2), (4) Date: Jun. 25, 2013

(87) PCT Pub. No.: WO2013/147923
PCT Pub. Date: Oct. 3, 2013

(65) Prior Publication Data
US 2014/0223231 A1 Aug. 7, 2014

(30) Foreign Application Priority Data
Mar. 30, 2012 (WO) ................ PCT/US2012/031709

(51) Int. Cl.
*G06F 11/07* (2006.01)
*G11C 16/16* (2006.01)

(52) U.S. Cl.
CPC ..................................... *G11C 16/16* (2013.01)

(58) Field of Classification Search
CPC . G06F 11/0787; G06F 11/1441; G06F 12/00; G06F 12/0246; G06F 12/023; G06F 2212/1032; G06F 2212/7205; G06F 2212/1004; G06F 2212/7202; G06F 2212/7204; G11C 16/16; G11C 16/10; G11C 16/34

See application file for complete search history.

(56) References Cited

U.S. PATENT DOCUMENTS

| | | |
|---|---|---|
| 2008/0301359 A1 | 12/2008 | Smith et al. |
| 2009/0089484 A1 | 4/2009 | Chu |
| 2009/0172250 A1 | 7/2009 | Allen et al. |
| 2010/0030999 A1 | 2/2010 | Hinz |
| 2010/0274951 A1 | 10/2010 | Fang et al. |
| 2010/0332896 A1 | 12/2010 | Wilson et al. |
| 2011/0055455 A1* | 3/2011 | Post et al. ................... 711/103 |
| 2011/0093650 A1* | 4/2011 | Kwon et al. ................. 711/103 |

(Continued)

FOREIGN PATENT DOCUMENTS

| | | |
|---|---|---|
| WO | 2009020845 A1 | 2/2009 |
| WO | 2009086421 A1 | 7/2009 |
| WO | 2010111694 A2 | 9/2010 |

OTHER PUBLICATIONS

International Search Report and Written Opinion for PCT/US2012/031709, mailed Aug. 23, 2013, 13 pages.
International Preliminary Report on Patentability for PCT/US2012/031709, mailed Oct. 9, 2014, 8 pages.

(Continued)

*Primary Examiner* — Nadeem Iqbal
(74) *Attorney, Agent, or Firm* — Schwabe, Williamson & Wyatt, P.C.

(57) ABSTRACT

Embodiments of the present disclosure describe devices, methods, computer-readable media and systems configurations for solid state drive management in power loss recovery. Other embodiments may be described and/or claimed.

19 Claims, 5 Drawing Sheets

(56) References Cited

U.S. PATENT DOCUMENTS

2011/0099326 A1\* 4/2011 Jung et al. .................... 711/103
2011/0258487 A1\* 10/2011 Royer et al. .................... 714/15
2012/0005558 A1 1/2012 Steiner et al.
2012/0042211 A1 2/2012 Brown et al.
2012/0246383 A1\* 9/2012 Asano et al. ................. 711/102

OTHER PUBLICATIONS

International Preliminary Report on Patentability for PCT/US2012/041413, mailed Oct. 9, 2014, 6 pages.
International Search Report and Written Opinion for PCT/US2012/041413, mailed Dec. 27, 2012, 7 pages.

\* cited by examiner

SOLID STATE DRIVE MANAGEMENT IN POWER LOSS RECOVERY

CROSS REFERENCE TO RELATED APPLICATIONS

The present application is a national phase entry under 35 U.S.C. §371 of International Application No. PCT/US2012/041413, filed Jun. 7, 2012, entitled "SOLID STATE DRIVE MANAGEMENT IN POWER LOSS RECOVERY," which designates, among the various States, the United States of America, which application claims priority to International Application No. PCT/US2012/031709, filed Mar. 30, 2012. The entire content and disclosures of International Application Nos. PCT/US2012/041413 and PCT/US2012/031709 are hereby incorporated by reference in their entireties.

FIELD

Embodiments of the present invention relate generally to the field of solid state drives, and more particularly, to solid state drive management in power loss recovery.

BACKGROUND

Solid state drives (SSDs) may significantly improve input/output performance of computer systems. SSDs may be built using multilevel cell (MLC) NAND in which each memory cell of an array may have at least four states, capable of storing at least two bits of data. In a writing operation in an MLC NAND, data for a lower page may be written and, subsequently, data for an upper page, which corresponds with the lower page, may be written. Lower-page corruption may occur when a power failure happens while data from the corresponding upper page is being written into the cells.

Some SSDs include additional power-fail protection circuitry, composed of power control logic as well as capacitors to store power. However, this solution may be associated with both cost and space required for the power-fail protection circuitry.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe solid state drive management in power loss recovery. The described embodiments may provide power loss recovery that reduces, partially or fully, data loss from lower-page corruption without the use of capacitors dedicated to preventing lower-page corruption.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific numbers, materials, and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the illustrative embodiments; however, the order of description should not be construed as to imply that these operations are necessarily order dependent. In particular, these operations need not be performed in the order of presentation.

The phrase "in some embodiments" is used repeatedly. The phrase generally does not refer to the same embodiments; however, it may. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B". The phrase "at least one of A, B and C" means (A), (B), (C), (A and B), (A and C), (B and C) or (A, B and C). The phrase "(A) B" means (B) or (A and B), that is, A is optional.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Figure 1:
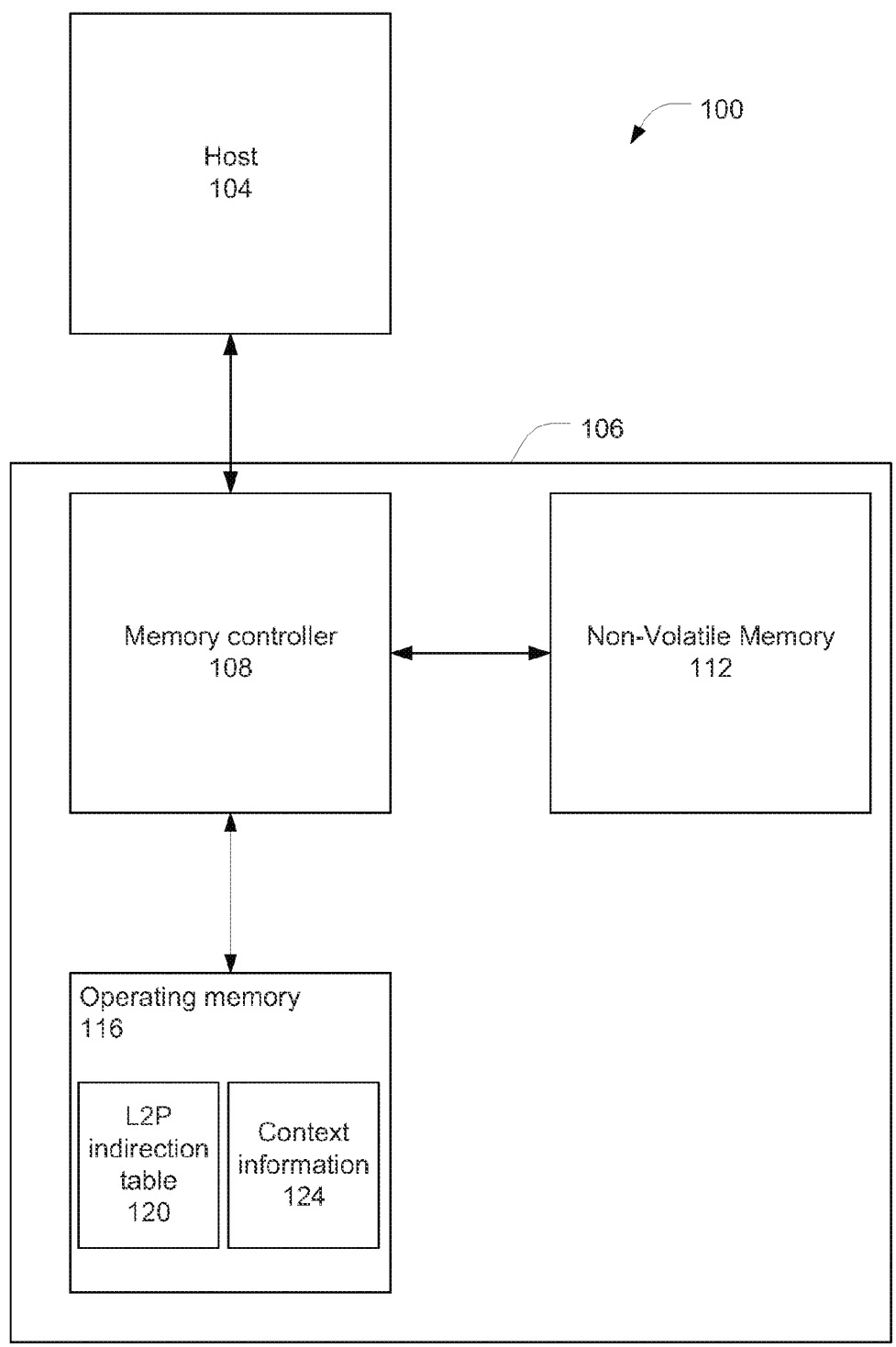
FIG. 1 schematically illustrates a computing device in accordance with various embodiments.

FIG. 1 schematically illustrates a computing device 100 in accordance with some embodiments. The device 100 may include a host 104, coupled with a solid state drive (SSD) 106. The SSD 106 may include a memory controller 108 that is coupled with non-volatile memory (NVM) 112. The SSD 106 may be a storage device that uses the NVM 112 to store persistent data. The NVM 112 may be a solid-state memory such as, but not limited to, NAND Flash memory, phase-change memory (PCM), phase-change memory and switch (PCMS), etc. In other embodiments, the NVM 112 may be other types of solid-state memory. The NVM 112 may be single-level cell (SLC) or MLC memory.

The host 104 may be an entity, e.g., an application, an operating system, etc., that generates memory access requests and transmits the memory access requests to the SSD 106. As used herein, a memory access request may be a request for a memory access, e.g., read, write, erase, etc., directed to the SSD 106.

The memory controller 108 may be a module that accesses the NVM 112 based on the memory access request. The memory controller 108 may additionally perform various management operations to ensure the integrity of the data stored in the NVM 112 as will be described.

The device 100 may further include operating memory 116 coupled with the memory controller 108 as shown. The operating memory 116 may store data and/or instructions in an accessible manner to facilitate run-time access of the data/ instructions. In some embodiments, the operating memory 116, or portions thereof, may be part of the NVM 112, volatile memory (e.g., random access memory (RAM)), cache memory, etc.

The operating memory 116 may include, in particular, a logical-to-physical (L2P) indirection table 120 (hereinafter "table 120") that is maintained by the memory controller 108. The table 120 may map logical addresses to physical addresses of the NVM 112. The table 120 may act as logical memory that is referenced by memory access requests from the host 104. For example, the memory controller 108 may receive a memory access request from the host 104 that includes a logical address and then determine the corresponding physical address based on the table 120.

The operating memory 116 may also include context information 124. The context information 124 may include state information, e.g., context, which has been saved in order to allow an operating state to be reestablished after an interruption, scheduled or unscheduled. The context information may be a combination of the table 120 and other state information that is periodically saved to the NVM 112. The latest copy of the context information 124 may be used by the memory controller 108 at the beginning of a power loss recovery (PLR) operation to set a beginning state of the NVM 112 on power up. During a PLR operation, given that the context information 124 will only be up-to-date until the time in which it was saved, the memory controller 108 may perform a replay operation to attempt to update the context information 124 by scanning the NVM 112 that was written since the context information 124 was last saved.

The table 120 and/or context information 124 may be stored in a non-volatile portion of the operating memory 116, e.g., a portion of the NVM 112.

Figure 2:
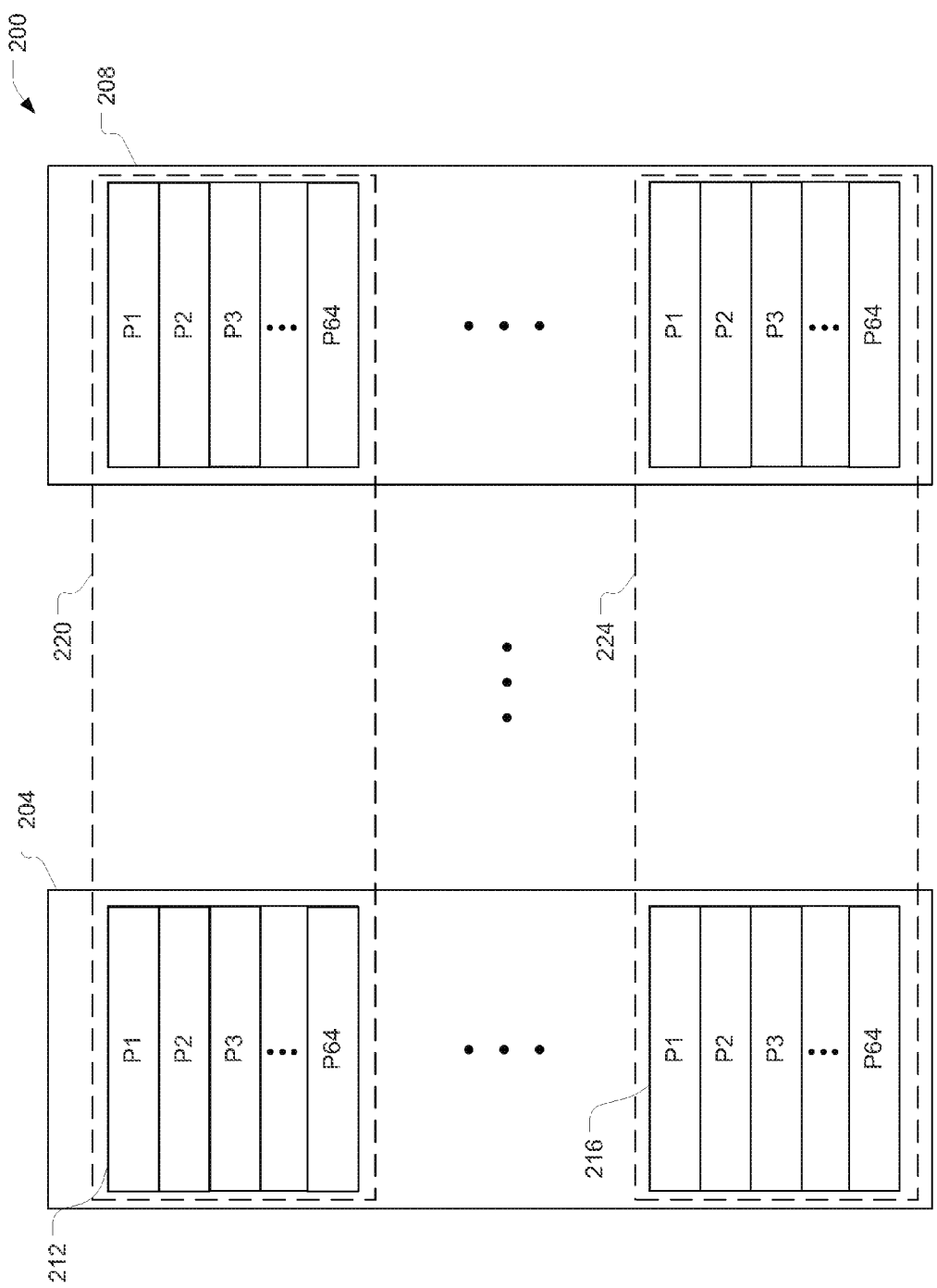
FIG. 2 schematically illustrates a memory space in accordance with various embodiments.

FIG. 2 schematically illustrates a memory space 200 of a NAND device, e.g., NVM 112, in accordance with some embodiments. In particular, the memory space 200 includes a number of die, e.g., die1 204, . . . die4 208.

Each die may include a number of erase blocks (EBs), with each EB including a number of pages. For example, die1 204 is shown with EB1 212, . . . EB128 216 with each EB having 64 pages. Each of the pages of the die may be an upper or lower page and may correspond to a complementary lower or upper page. For embodiments described herein, P1 will be considered to be a lower page and P3 will be considered to be an upper page that corresponds to P1.

The memory space 200 may include a number of logical bands, with each logical band including a corresponding EB from each of the die spaces. For example, band1 220 may include an EB1 from each die, and band128 224 may include an EB128 from each die.

It will be understood that the number of EBs, pages, die and bands are shown as examples only. Other embodiments may include numbers other than those specifically shown.

In accordance with some embodiments, read and write operations may occur at a page granularity, while erase operations may occur at an EB granularity. Prior to re-writing, a filled page must be erased as part of an EB. Since data written to an EB will be erased prior to being re-written, a defragmentation (defrag) operation may move valid data from one EB to another EB before the erase happens.

After a power loss, the memory controller 108 may perform a PLR operation. In a PLR operation, the memory controller 108 may rebuild the table 120 using the most recently saved context, which will include an earlier version of the table 120. The memory controller 108 may then perform a replay operation, by scanning the NVM 112 to determine writes that occurred, e.g., to an active band, after the time in which the context was last saved, in an attempt to further update the table 120.

In conventional systems, a replay operation may stop once an error is detected by, e.g., checking error correcting codes (ECCs) on the writes to the NVM 112. Assume P1 of EB1 212 was corrupted due to a lower-page corruption event, e.g., a power failure occurred when writing to P3 of EB1 212. A replay operation would then stop at P1. If, during a defrag operation, a logical block address (LBA) A was defragged to a location in P2 and deleted from defragged location, then the data of LBA A may be irrecoverably lost due to the lower-page corruption. Embodiments of the present disclosure provide mechanisms that may be used to prevent the loss of data in these and other instances.

Figure 3:
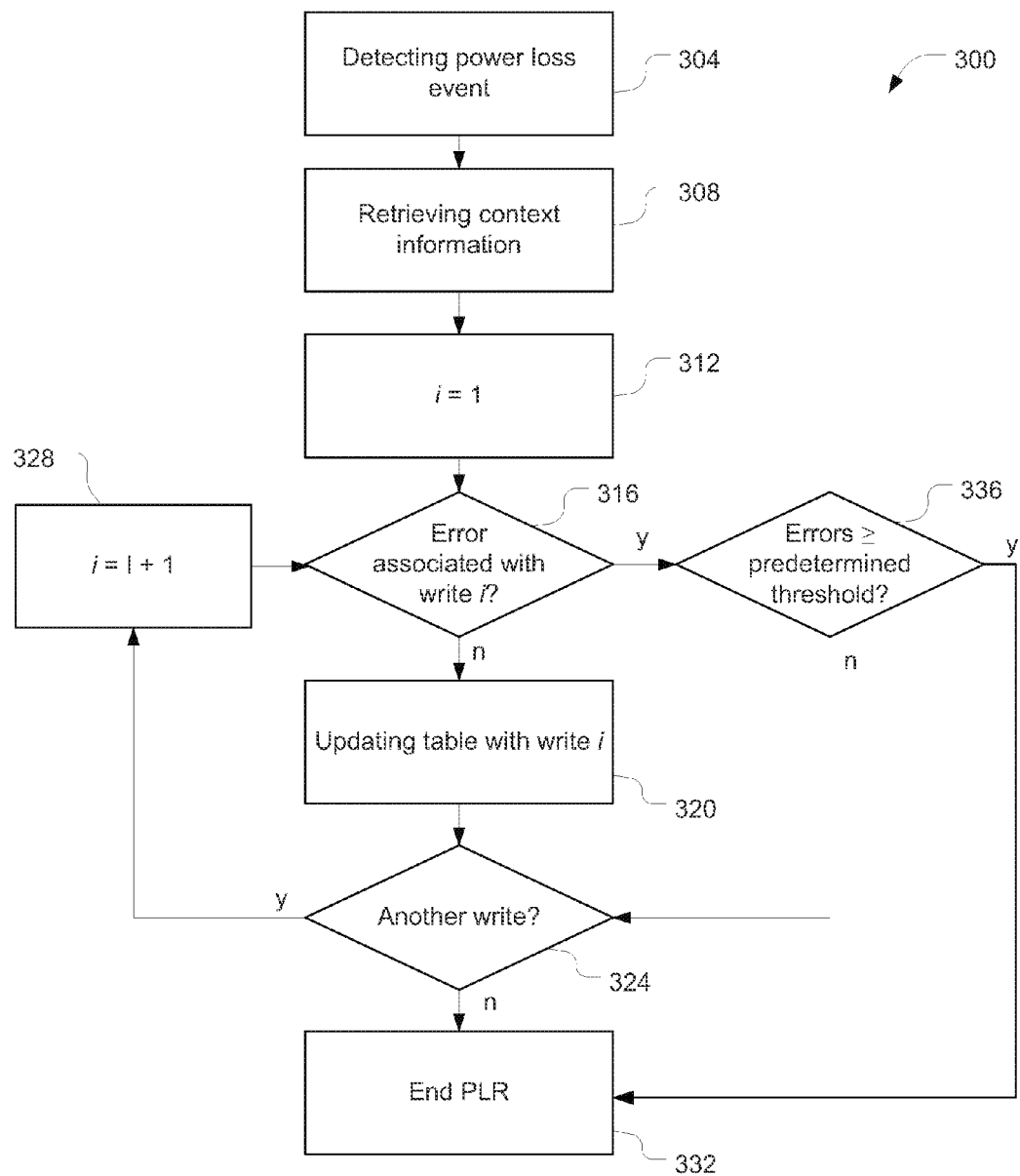
FIG. 3 is a flowchart illustrating a power-loss recovery operation in accordance with various embodiments.

FIG. 3 is a flowchart illustrating a power loss recovery (PLR) operation 300 in accordance with some embodiments. The PLR operation 300 may be performed by the memory controller 108 in some embodiments.

The PLR operation 300 may include, at block 304, detecting a power-loss event.

Following block 304, the PLR operation 300 may include, at block 308, retrieving context information 124. The context information 124 may be retrieved from NVM 112 and moved to operational memory 116. This may set the table 120 to a state at which the context information 124 was last saved in some embodiments.

Following block 308, the PLR operation 300 may proceed to replay writes, in blocks 312-336, that occurred subsequent to last saving of the context information 124. In the replay of writes, bands written since the time at which the context information 124 was last saved may be scanned in the order in which they were written. This may be determined from a sequence number written to each band.

The PLR operation 300 may include, at block 312, initializing an index value. For example, i may be set equal to one. The index value, i, may correspond to a page.

Following block 312, the PLR operation 300 may include, at block 316, determining whether an error is associated with write i. This may be done by checking an ECC associated with the data of write i.

In the event it is determined, at block 316, that no error is associated with write i, then the PLR operation 300 may advance to updating table 120 with write i, at block 320.

After block 320, the PLR operation 300 may include determining, at block 324, whether there are any additional writes to consider.

If there are additional writes, the index value may be incremented, at block 328, and the PLR operation 300 may loop back to block 316.

If, in block 324, it is determined there are no additional writes, the PLR operation 300 may end at block 332.

In the event it is determined, at block 316, that an error is associated with write i, then the PLR operation 300 may advance to block 336.

At block 336, the PLR operation 300 may include determining whether a number of errors is greater than or equal to a predetermined threshold number of errors. If so, the PLR operation 300 may end at block 332. In various embodiments, the predetermined threshold number of errors may be consecutive errors, number of errors over a given number of memory locations, e.g., pages, or some other value. The predetermined threshold number may be any number greater than one.

If, at block 336, it is determined that the number of errors is less than the predetermined threshold number of errors, the PLR operation 300 may advance to block 324.

In various embodiments, the location of the table 120 at which a write associated with an error was to be updated may be updated to indicate null, or bad, data. However, contrary to conventional PLRs, the PLR operation 300 may not stop upon a first detection of an error. In this manner, the table 120 may be updated with information from valid writes to subsequent memory locations, e.g., a subsequent page.

Consider, e.g., an embodiment in which the power loss event occurs during writing of P3 of EB1 212. In this embodiment, an error may be detected with the write of P1 data. Assuming the threshold number of errors had not been reached, the PLR operation 300 may not stop updating table 120 with this write. Instead, the write to P2 may also be scanned and valid data written to P2 may be successfully recovered and updated in the table 120.

In the manner described, the memory controller 108 may sequentially update the table 120 with a plurality of writes that occurred subsequent to a time at which the context information 124 was last saved until all the writes to the NVM 112 are re-written or a determination that a number of errors associated with the replay is greater than or equal to the predetermined threshold. At the point of determination that the number of errors associated with the replay is greater than or equal to the predetermined threshold, the memory controller 108 may cease the PLR operation 300.

While FIG. 3 describes a PLR operation that may facilitate recovery of valid data, other embodiments describe operations that may prevent loss or corruption of valid data utilizing secured and unsecured states of the data.

Figure 4:
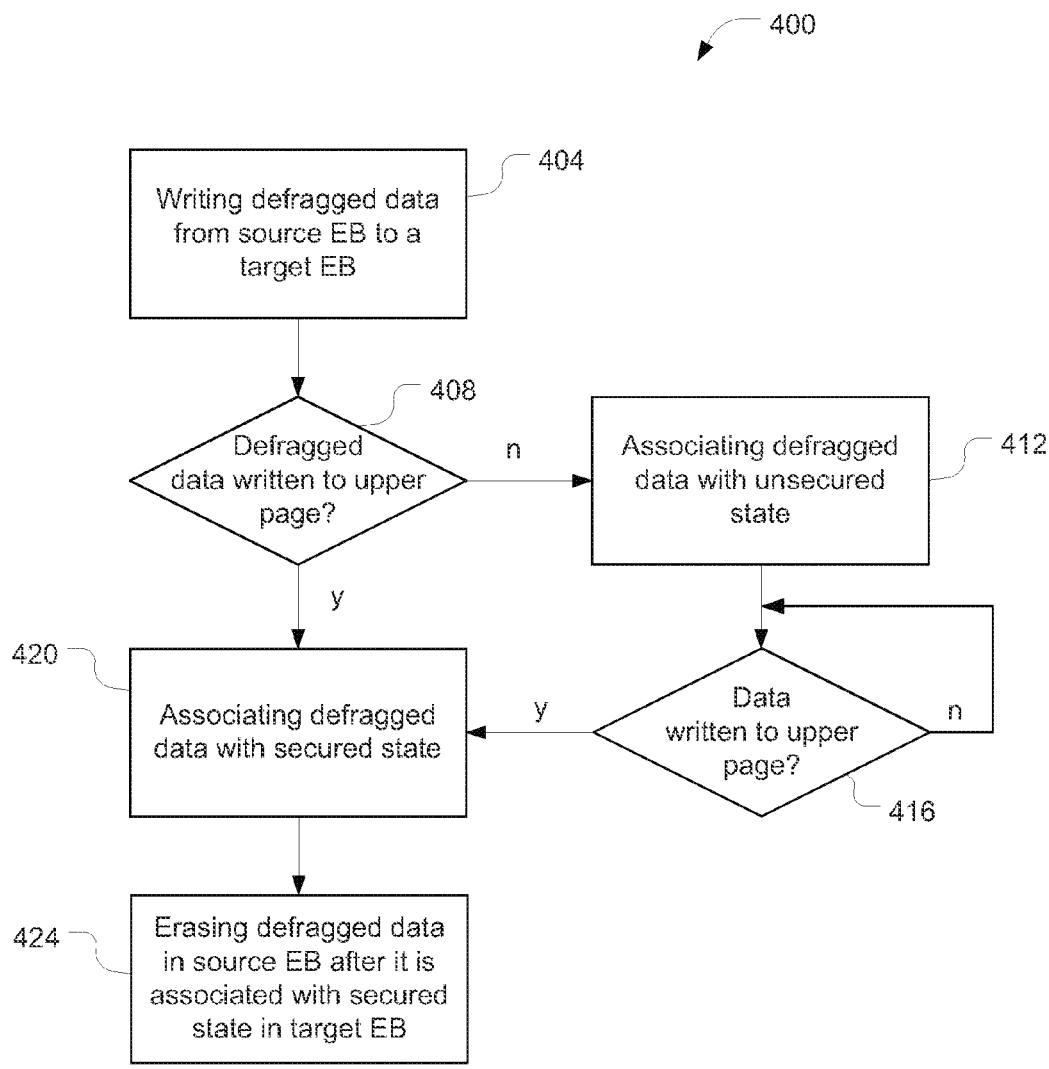
FIG. 4 is a flowchart illustrating a defragmentation operation in accordance with various embodiments.

FIG. 4 is a flowchart of a defrag operation 400 in accordance with an embodiment of the present invention. The defrag operation 400 may be performed by the memory controller 108.

The defrag operation 400 may include, at block 404, writing defragged data from source EB to target EB. The defragged data may be the last remaining valid data in the source, or defragged, erase block.

After block 404, the defrag operation 400 may include, at block 408, determining whether the defragged data is written to an upper page of the target EB.

If it is determined, at block 408, that the defragged data is written to an upper page, the defrag operation 400 may include, at block 412, associating the defragged data with a secured state.

If it is determined, at block 408, that the defragged data is not written to an upper page, the defrag operation 400 may include, at block 420, associating the defragged data with an unsecured state. In some embodiments, the data may be associated with an unsecured state by the memory controller 108 setting a flag that corresponds to the data as it is stored in the source EB in order to avoid erasure of the source EB. The memory controller 108 may further determine, and store for later reference, a location stamp of the location of the target EB in which the defragged data was written.

After block 412, the defrag operation 404 may include, at block 416, determining whether other data is successfully written to an upper page. The upper page may be an upper page of the target EB that corresponds to the lower page in which the defragged data was written. The other data may be other host writes.

If it is determined, at block 416, that data has not been written to the upper page, the defrag operation 400 may continue to monitor writes to the upper page by looping back to block 416. In some embodiments, the memory controller 108 may identify a location in the upper page based on the location stamp previously stored in block 412. This location in the upper page may be monitored for successful writes in some embodiments.

If it is determined, at block 416, that the data is written to the upper page, the defrag operation 400 may include, at block 420, associating the defragged data with a secured state.

Following block 420, the defrag operation 400 may include, at block 424, erasing the defragged data in source EB after it is associated with secured state in target EB. Thus, erasing of the defragged data may be postponed until the defragged data is in a secure state in its new location.

A specific example of the defrag operation 400, with respect to FIG. 2, may include the following. In the defragging of EB128 216, data from logical block address (LBA) 7 may be written to P1 of EB1 212 (block 404). This may be the last valid data of EB128 216, thereby satisfying a condition precedent for erasing EB128 216.

The memory controller 108 may determine that the P1 of EB1 212 is a lower page (block 408) and, therefore, associate LBA 7 in EB128 216 with an unsecured state (block 412). This may prevent erasing of EB128 216.

The memory controller 108, in the context of the defrag operation 400, may monitor writes to the EB1 212. Once data is written to P3, which is the upper page corresponding to P1, the memory controller 108 may associate LBA 7 in EB128 216 with a secured state (block 420). This may enable erasing of EB128 216, including LBA 7.

In the event that LBA 7 was lost from EB1 212 prior to being set to a secured state, e.g., in the event lower-page corruption occurred, the memory controller 108 may be able to access LBA 7 from EB128 216. In this manner, the NVM 112 may be left in a consistent (write-order behaving) state at the end of replay. That is, the defragging of EB128 216 may be performed again with LBA 7 being re-written to EB1 212.

In some embodiments, portions of the defrag operation 400 may be implemented by the memory controller 108 placing an erase operation of the source EB in a deferred erase queue. The erase operation may be held in the deferred erase queue until a determination that all the valid data from the source EB has been written to a target EB and is associated with a secured state within the target EB.

In some embodiments, data written to a lower page may be associated with an unsecured state until a host writes valid data to the corresponding upper page. However, in other embodiments, pad, or null data may be written to the corresponding upper page.

Consider, for example, an embodiment in which the memory controller 108 receives a flush command from the host 104 after the writing of data to P1 of EB1 212. In this example, the memory controller 108 may write pad data to corresponding upper page 3 (in addition to any other memory locations between P1 and P3 of EB1 212 in a particular write sequence of the NAND device) to ensure validity of all data written prior to receipt of the flush command. The memory controller 108 may then set the data in P1 to a secure state and return a flush-complete message to the host 104. Pad data may be designed to be written to the pages in a manner that reduces or eliminates write cycles of the NVM 112. Thus, the chance of data corruption due to power loss may be reduced or eliminated.

Figure 5:
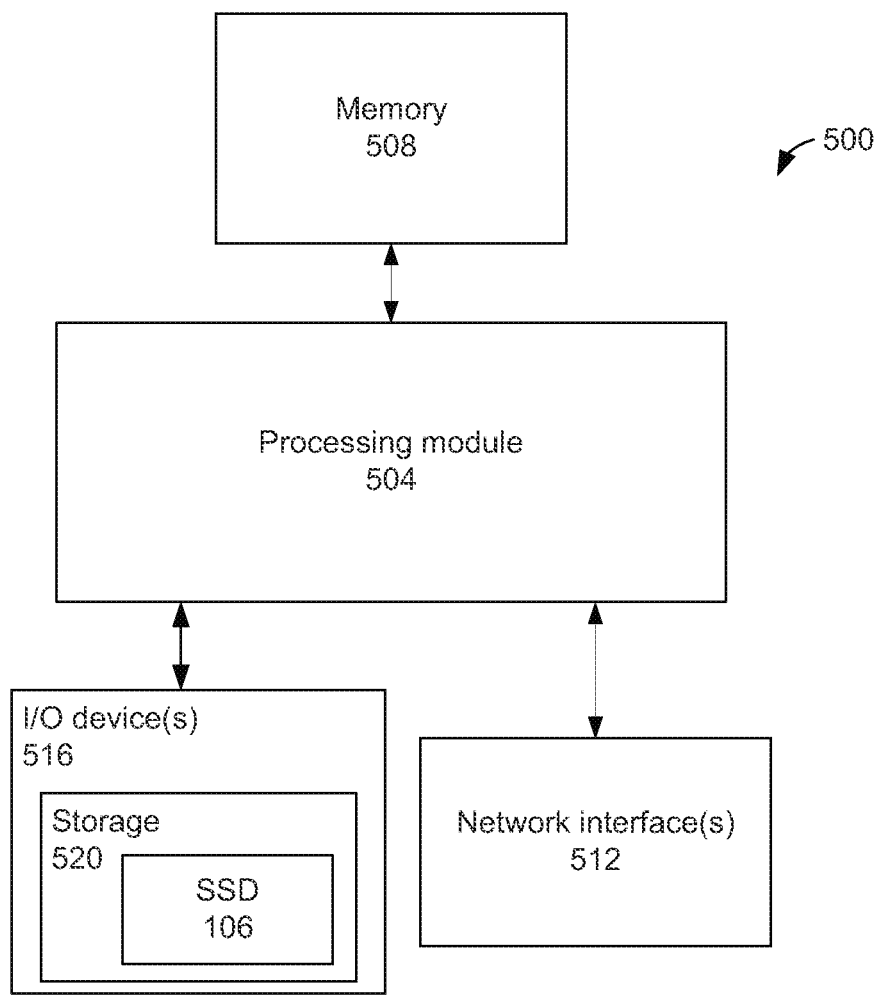
FIG. 5 schematically depicts an example system in accordance with various embodiments.

Embodiments of the present disclosure may be implemented into a system using any suitable hardware and/or software to configure as desired. FIG. 5 illustrates, for one embodiment, an example system 500 comprising a processing module 504, memory 508 coupled to the processing module 504, network interface(s) 512 coupled to processing module 504, and input/output device(s) 516 coupled to processing module 504.

The processing module 504 may include one or more single-core or multi-core processors. The processors may include any combination of general-purpose processors and dedicated processors (e.g., graphics processors, application processors, etc.). Applications, operating systems, etc., executing on one or more processors of the processing module 504 may include host 104 issuing the memory access requests directed to a memory controller similar to that described above with respect to FIG. 1.

The processing module 504 for one embodiment may include any suitable interface controllers to provide for any suitable interface to the memory 508, network interface(s) 512, and/or I/O device(s) 516.

The processing module 504 may include one or more processors packaged together with control logic to form a System in Package (SiP) or system on chip (SoC) package. For example, one or more of the processor(s) may be integrated with control logic to provide the memory controller 520 as an SoC package.

Memory 508 may be used to load and store data and/or instructions for system 500. The memory/may include one or more tangible, non-transitory computer-readable media used to store data and/or instructions, for example. The memory/storage 508 may include any suitable volatile memory such as, but not limited to, dynamic random access memory (DRAM).

Network interface(s) 512 may provide one or more interface(s) for system 500 to communicate over one or more network(s) and/or with any other suitable device. Network interface(s) 512 may include any suitable hardware and/or firmware. Network interface(s) 512 for one embodiment may include, for example, a network adapter, a wireless network adapter, a telephone modem, and/or a wireless modem. For wireless communications, network interface(s) 512 may use one or more antennas to wirelessly couple the system 500 to a radio access network.

The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The network interface(s) 512 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 2G, 3G, 4G, 5G, and beyond. In some embodiments, the network interface(s) 512 may include first communication module dedicated to shorter range wireless communications such as Wi-Fi and Bluetooth and a second communication module dedicated to longer range wireless communications such as GPS, EDGE, GPRS, CDMA, WiMAX, LTE, Ev-DO, and others.

The I/O devices(s) 516 may include storage 520 that is designed to store data and/or instructions in a non-volatile manner. The storage 520 may include the SSD 106. The storage 520 may additionally include other types of storage including, but not limited to, a hard disk drive (HDD), compact disk (CD) drive, digital versatile disk (DVD) drive, etc.

The storage 520 may include a storage resource physically part of a device on which the system 500 is installed or it may be accessible by, but not necessarily a part of, the device. For example, a portion of the storage 520 may be accessed over a network via the network interface(s) 512.

The I/O device(s) 516 may also include user interfaces designed to enable user interaction with the system 500, peripheral component interfaces designed to enable peripheral component interaction with the system 500, and/or sensors designed to determine environmental conditions and/or location information related to the system 500. In various embodiments, the user interfaces could include, but are not limited to, a display, e.g., a liquid crystal display, a touch screen display, etc., a speaker, a microphone, a still camera, a video camera, a flashlight (e.g., a light emitting diode flash), and a keyboard. In various embodiments, the peripheral component interfaces may include, but are not limited to, a non-volatile memory port, an audio jack, and a power supply interface. In various embodiments, the sensors may include, but are not limited to, a gyro sensor, an accelerometer, a proximity sensor, an ambient light sensor, and a positioning unit. The positioning unit may also be part of, or interact with, the network interface(s) 512 to communicate with components of a positioning network, e.g., a global positioning system (GPS) satellite.

In various embodiments, the system 500 may be a mobile computing device such as, but not limited to, a laptop computing device, a tablet computing device, a netbook, a smartphone, etc. In various embodiments, system 500 may have more or less components, and/or different architectures.

The disclosure may include various example embodiments such as those described below.

What is claimed is:

1. An apparatus comprising:
a memory controller configured to defragment a non-volatile memory by being configured to:
write valid data from a first erase block into a page of a second erase block;
determine whether the valid data is associated with a secured state in the page;
erase the first erase block based on a determination that the valid data is associated with the secured state;
determine whether the page of the second erase block is a lower page; and
determine whether the valid data is associated with an unsecured state based on a determination that the page is the lower page.

2. The apparatus of claim 1, wherein the memory controller is further configured to determine whether the valid data is associated with the secured state by being configured to:
determine whether data is successfully written to an upper page that corresponds to the lower page.

3. The apparatus of claim 2, wherein the valid data corresponds to a logical block address (LBA).

4. The apparatus of claim 2, wherein the memory controller is further configured to:
store a location stamp associated with the lower page based on write of the valid data into the lower page; and
identify the upper page based on the location stamp.

5. The apparatus of claim 2, wherein the memory controller is further configured to schedule an erase operation in a deferred erase queue until determination that the upper page is written successfully.

6. The apparatus of claim 2, wherein the memory controller is further configured to:
receive a flush command after a write of the valid data into the lower page;
write pad data to an upper page; and return a flush-complete message after the write of the pad data to the upper page.

7. The apparatus of claim 1, wherein the memory controller is further configured to:
monitor writes to an upper page of the second erase block; and
determine whether the valid data is associated with the secured state based on monitored writes.

8. The apparatus of claim 1, further comprising:
a host configured to issue a plurality of memory access requests to the memory controller.

9. The apparatus of claim 1, wherein the apparatus comprises a solid-state drive having the non-volatile memory.

10. The apparatus of claim 1, further comprising:
a wireless interface configured to wirelessly couple the apparatus to a radio access network.

11. The apparatus of claim 10, comprising: a mobile computing device having the non-volatile memory and the memory controller.

12. One or more non-transitory computer-readable media having instructions stored thereon that, if executed by one or more processors, cause a device to:
write data from a first erase block to a lower page within a second erase block;
monitor writes to an upper page within the second erase block;
schedule an erase of the first erase block based on monitored writes;
schedule the erase of the first erase block based on completion of a write to the upper page;
associate the data with an unsecured state based on said write of data to the lower page; and
after said association of the data with the unsecured state, associate the data with a secured state based on said monitor of writes to the upper page.

13. The one or more non-transitory computer-readable media of claim 12, wherein the data is written to a first location in the lower page and the instructions, if executed, further cause the device to:
schedule an erase operation in a deferred erase queue until a determination that a write to the upper page is successfully completed.

14. A method, comprising:
detecting a power loss event related to a solid-state drive (SSD);
accessing saved context information based on detected power-loss event;
restoring a logical-to-physical (L2P) indirection table based on the saved context information; and
updating the L2P indirection table based on a plurality of writes to a non-volatile memory (NVM) of the SSD that occurred subsequent to a saving of the context information;
determining whether a number of errors associated with the updating is greater than a predetermined threshold that is greater than one; and
ceasing the updating based on a determination that a number of errors associated with the updating is greater than a predetermined threshold.

15. The method of claim 14, further comprising:
checking an error correction code (ECC) associated with individual writes of the plurality of writes to determine whether the individual writes are associated with an error.

16. The method of claim 14, wherein the plurality of writes include a plurality of page writes.

17. The method of claim 14, wherein the predetermined threshold is a number of consecutive errors.

18. The method of claim 14, wherein the predetermined threshold is a number of page errors.

19. One or more non-transitory computer-readable media having instructions stored thereon that, if executed by one or more processors, cause a device to perform a method in accordance with claim 14.

* * * * *